United States Patent [19]
Sekino

[11] Patent Number: 6,134,159
[45] Date of Patent: Oct. 17, 2000

[54] SEMICONDUCTOR MEMORY AND REDUNDANT CIRCUIT

[75] Inventor: Yoshimasa Sekino, Tokyo, Japan

[73] Assignee: Oki Electric Industry Co., Ltd., Tokyo, Japan

[21] Appl. No.: 09/379,721

[22] Filed: Aug. 24, 1999

[51] Int. Cl.[7] .................................................... G11C 7/00
[52] U.S. Cl. ...................................... 365/200; 365/225.7
[58] Field of Search ................................ 365/200, 225.7, 365/185.09

[56] References Cited

U.S. PATENT DOCUMENTS

| | | | |
|---|---|---|---|
| 5,502,676 | 3/1996 | Pelley, III et al. ....................... | 365/200 |
| 6,018,488 | 1/2000 | Mishima et al. ......................... | 365/200 |
| 6,021,075 | 2/2000 | Ueno ....................................... | 365/200 |

*Primary Examiner*—Tan T. Nguyen
*Attorney, Agent, or Firm*—Jones Volentine, LLC

[57] ABSTRACT

A semiconductor memory includes a memory array; data buses connected to the memory array; a plurality of data transmission circuits connected to the data buses one by one; and a buffer circuit connected to an outside device. The memory further includes a gate circuit arranged between the data transmission circuits and the buffer circuit; and a fuse connected to the gate circuit. The data transmission circuits are selectively connected to the buffer circuit by controlling the fuse and the gate circuit, so that a defective element is replaced with a normal element.

18 Claims, 7 Drawing Sheets

SEMICONDUCTOR MEMORY AND REDUNDANT CIRCUIT

TECHNICAL FIELD OF THE INVENTION

The present invention generally relates to integrated circuits, and in particular the present invention relates to a semiconductor memory and a redundant circuit introduced in such a memory.

BACKGROUND OF THE INVENTION

A typical DRAM (Dynamic Random Access Memory) includes addressable memory cells arranged in rows and columns. One of the major determinants of the cost of producing memory chips is wafer yield, which is defined as the ratio of non-defective chips and the total chips fabricated on a given wafer. In general, the higher the integration density of the memory chip, the higher the probability that one or more memory cells thereof will be defective. Thus, the higher the integration density of the chips fabricated on a given wafer, the lower the wafer yield. Accordingly, the need for a method for correcting defects in order to enhance wafer yield became more acute with the advent of high-density memory chips.

The single most effective method in which to correct memory cell defects in order to enhance wafer yield is the provision of a redundant memory circuit in which one or more redundant rows and/or columns of memory cells are provided in order to replace rows and/or columns of the main memory array which are found to be defective, during testing, e.g., during wafer sort.

In operation, when a memory read or write cycle is executed, access to the defective rows and/or columns is prevented, and redundant decoders are responsive to only the addresses of the defective rows and/or columns, to thereby effectively replace the defective rows and/or columns with the redundant rows and/or columns, which are sometimes, referred to as spare rows and/or columns. This technique of replacing defective rows and/or columns with redundant rows and/or columns is oftentimes referred to as repairing defective memory cells.

According to the conventional technology of semiconductor memories, a wafer yield can not be enhanced sufficiently. Such a problem is remarkable for DRAMs that are mounted in an LSI.

OBJECTS OF THE INVENTION

Accordingly, an object of the present invention is to provide a semiconductor memory that contributes to enhance a wafer yield.

Another object of the present invention is to provide a redundant circuit introduced into a semiconductor memory that contributes to enhance a wafer yield.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor memory includes a memory array in which memory cells are arranged in rows and columns; and a plurality of data buses, which are connected to the memory array. The semiconductor memory further includes a plurality of data transmission circuits, which are connected to the data buses one by one; a buffer circuit, which is connected to an outside device; a gate circuit which is arranged between the data transmission circuits and the buffer circuit; and a fuse which is connected to the gate circuit. The data transmission circuits are selectively connected to the buffer circuit by controlling the fuse and the gate circuit, so that a defective element is replaced with a normal element.

According to a second aspect of the present invention, a semiconductor memory includes a memory array in which memory cells are arranged in rows and columns; a plurality of data buses, which are connected to the memory array; and a buffer circuit, which is connected to an outside device. The semiconductor memory further includes a data transmission circuit, which is connected to the buffer circuit; a gate circuit which is arranged between the data transmission circuit and the data buses; and a fuse which is connected to the gate circuit. The data buses are selectively connected to the data transmission circuit by controlling the fuse and the gate circuit, so that a defective memory cell is replaced with a normal memory cell.

According to a third aspect of the present invention, a redundant circuit, used in a semiconductor memory, includes a primary data bus connected to primary memory cells; a primary data transmission circuit connected to the primary data bus; and a buffer circuit connected to an outside device. The redundant circuit further includes redundant memory cells; a redundant data bus which is connected to the redundant memory cells; a redundant data transmission circuit, which is connected to the redundant data bus; a gate circuit which is arranged between the primary data transmission circuits and the buffer circuit, and between the redundant data transmission circuit and the buffer circuit; and a fuse which is connected to the gate circuit. The redundant data transmission circuit is connected to the buffer circuit by controlling the fuse and the gate circuit when the primary memory cells are determined to be defective, so that the defective memory cells are replaced with the redundant memory cells.

According to a fourth aspect of the present invention, a redundant circuit, used in a semiconductor memory, includes a primary data bus connected to primary memory cells; and a buffer circuit connected to an outside device. The redundant circuit further includes redundant memory cells; a redundant data bus which is connected to the redundant memory cells; a data transmission circuit, which is connected to the buffer circuit; a gate circuit which is arranged between the data transmission circuit and the data buses; and a fuse which is connected to the gate circuit. The redundant data bus is connected to the data transmission circuit by controlling the fuse and the gate circuit when the primary memory cells are determined to be defective, so that the defective memory cell are replaced with the redundant memory cells.

DETAILED DISCLOSURE OF THE INVENTION

In the following detailed description of the preferred embodiments, reference is made to the accompanying drawings which form a apart hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
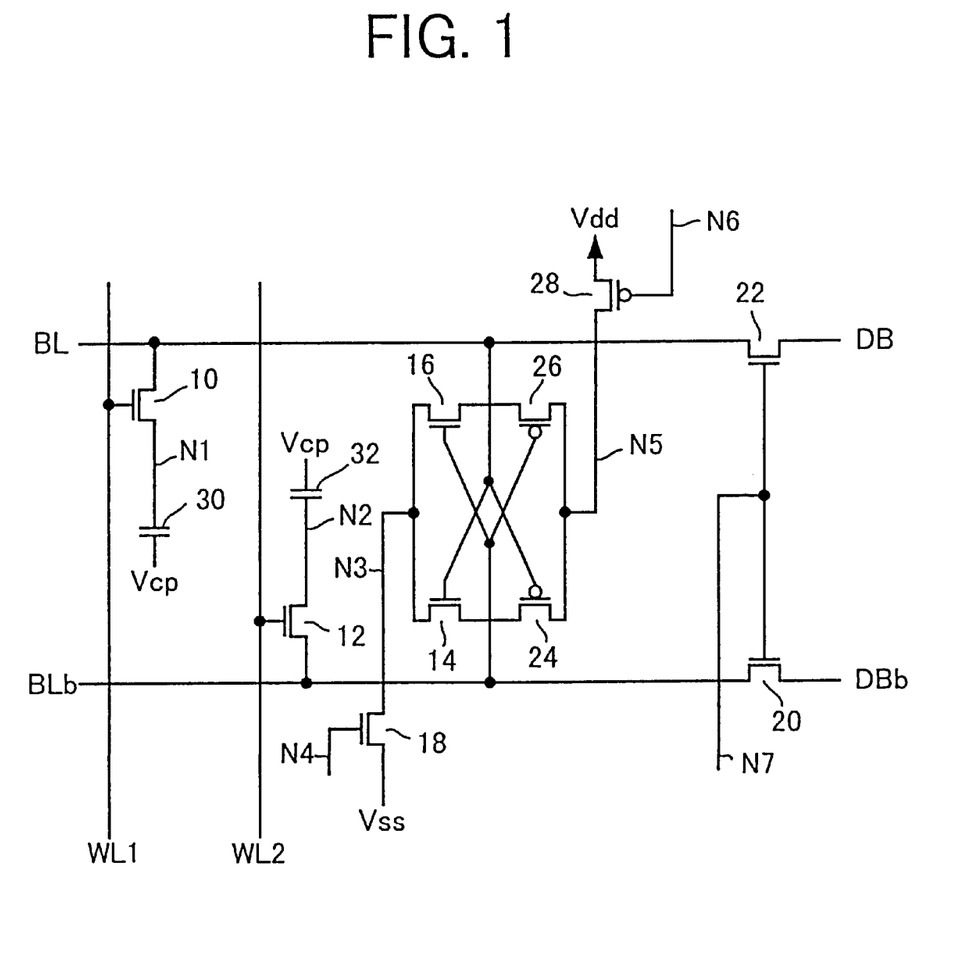
FIG. 1 is a block diagram illustrating a memory array, to which the present invention is applied.

FIG. 1 shows the circuitry of a two-bit type of memory array, which includes NMOS (N-channel Metal Oxide Semiconductor) transistors 10, 12, 14, 16, 20 and 22; PMOS (P-channel Metal Oxide Semiconductor) transistors 24, 26 and 28; and capacitors 30 and 32.

In the circuitry shown in FIG. 1, the NMOS transistor 10 is connected at a source to a node N1, at a drain to a bit line BL and at a gate to a word line WL1. One end of the capacitor 30 is connected to the node N1, and the other end is applied with a fixed voltage Vcp. The fixed voltage Vcp can be, for example, a half of a power supply voltage Vdd.

The NMOS transistor 12 is connected at a gate to a word line WL2, at a souse to a node N2, and at a drain to a bit line BLb. The capacitor 32 is connected at one end to the node N2, and is applied at the other end with the fixed voltage Vcp. The NMOS transistor 14 is connected at a drain to a node N3, at a gate to the bit line BL, and at a source to a source of the PMOS transistor 24. The NMOS transistor 16 is connected at a gate to the bit line BLb, at a drain to the node N3, and at a source to a source of the PMOS transistor 26. The NMOS transistor 18 is connected at a gate to a node N4, at a drain to the node N3, and at a source to the ground Vss. The NMOS transistor 20 is connected at a gate to a node N7, at a drain to the bit line BLb, and at a source to a data bus DBb. The NMOS transistor 22 is connected at a gate to the node N7, at a drain to the bit line BL, and at a source to a data bus DB.

The PMOS transistor 24 is connected at a drain to a node N5 and at a gate to the bit line BL. The PMOS transistor 26 is connected at a drain to the node N5 and at a gate to the bit line BLb. The PMOS transistor 28 is connected at a source to the node N5 and at a gate to a node N6. The PMOS transistor 28 is applied at a drain with the power supply voltage Vdd. The capacitor 32 is connected at one end to the node N2, and is applied at the other end with the fixed voltage Vcp.

Now the operation of the memory cell array, shown in FIG. 1, will be described, assuming that the node N1 is at a high voltage level "H" in logic; and ½ Vdd is applied to the bit lines BL and BLb and the nodes N5 and N3. When the word line WL1 at a low voltage "L" turns to a high voltage "H", the NMOS transistor 10 turns on and redistribution of electric charge is performed with the bit line BL. As a result, the bit line BL is applied with a voltage that is slightly (ΔV) higher than ½ Vdd. Next, when the node N4 turns from low "L" to high "H", and the node N6 turns from high "H" to low "L", the NMOS transistor 18 and PMOS transistor 28 turn on, so that the nodes N5 and N3 become high "H" and low "L", respectively.

As the bit line BL is applied with a voltage that is ΔV higher than the bit line BLb, the NMOS transistor 14 maintains its on state stronger than the NMOS transistor 16, and the PMOS transistor 26 maintains its on state stronger than PMOS transistor 24. Therefore, the bit lines BL and BLb turn to high "H" and low "L", respectively, and the sense operation is finished. After that, when the node N7 turns from low "L" to high "H", the NMOS transistors 20 and 22 turn on, so that the signals of high "H" and low "L" on the bit liens BL and BLb are supplied as read data to the data buses DB and DBb, respectively.

REDUNDANT CIRCUIT FOR READING OPERATION

Figure 2:
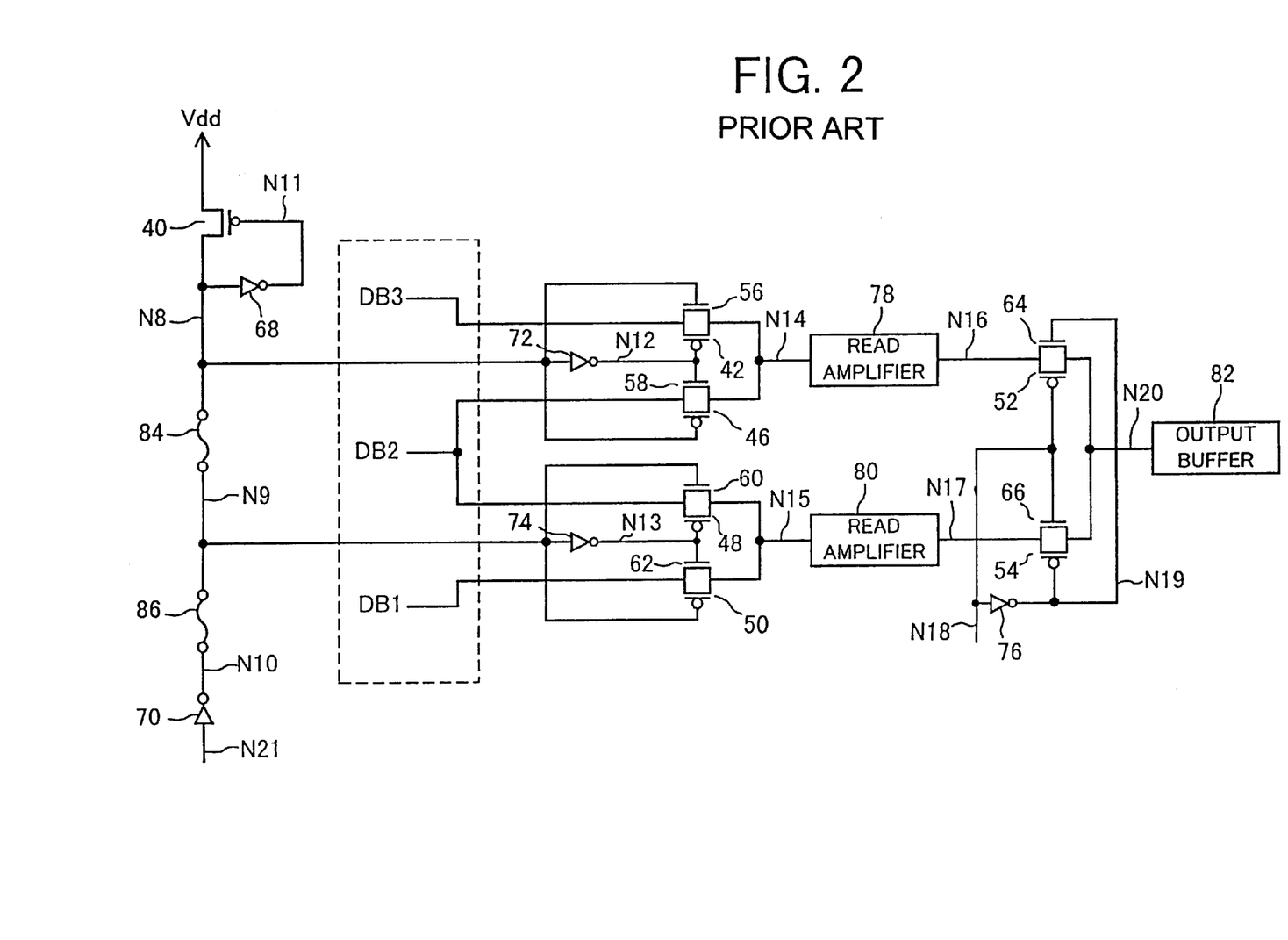
FIG. 2 is a block diagram illustrating a conventional column-redundant circuit for reading operation in a semiconductor memory.

For better understanding of the present invention, a conventional technology is first described. FIG. 2 shows a conventional column redundant circuit for reading operation, which is used in a semiconductor memory. Although, data buses (DB and DBb) are practically used as a pair in the semiconductor memory as shown in FIG. 1, they are shown as a single data bus (DB1–DB3) in FIG. 2 for easy understanding. In FIG. 2, a memory array is surrounded with a broken line.

The conventional redundant circuit includes PMOS transistors 40, 42, 46, 48, 50, 52 and 54; NMOS transistors 56, 58, 60, 62, 64 and 66; inverters 68, 70, 72, 74 and 76; programmable fuses 84 and 86; read amplifier circuits 78 and 80; and an output buffer circuit 82. In FIG. 2, data buses DB1 and DB2 are used as primary data buses that are connected to primary memory cells, while the data bus DB3 is used as a redundant data bus that is connected to redundant memory cells.

The PMOS transistor 40 is connected at a source to a node N8, and at a gate to a node N11. The PMOS transistor 40 is applied at a drain with a power supply voltage Vdd. The inverter 68 is connected at an input terminal to the node N8 and at an output terminal to the node N11. The programmable fuse 84 is connected between the node 8 and a node 9. The programmable fuse 86 is connected between the node N9 and a node N10. The inverter 70 is connected at an input terminal to a node N21 and at an output terminal to the node N10.

The PMOS transistor 42 is connected at a drain to the redundant data bus DB3, at a source to a node N14, and at a gate to a node N12. The inverter 72 is connected at an input terminal to the node N8, and at an output terminal to the node N12. The NMOS transistor 56 is connected at a drain to the redundant data bus DB3, at a source to the node N14, and at a gate to the node N8. The PMOS transistor 46 is connected at a drain to the primary data bus DB2, at a source to the node N14, and at a gate to the node N8. The NMOS transistor 58 is connected at a drain to the primary data bus DB2, at a source to the node N14, and at a gate to the node N12.

The PMOS transistor 48 is connected at a drain to the primary data bus DB2, at a source to a node N15, and at a gate to a node N13. The inverter 74 is connected at an input terminal to the node N9, and at an output terminal to the node N13. The NMOS transistor 60 is connected at a drain to the primary data bus DB2, at a source to the node N15, and at a gate to the node N9. The PMOS transistor 50 is connected at a drain to the primary data bus DB1, at a source to the node N15, and at a gate to the node N9. The NMOS transistor 62 is connected at a drain to the primary data bus DB1, at a source to the node N15, and at a gate to the node N13.

In normal operation, the primary data buses DB1 and DB2 are used, but the redundant data bus DB3 is not used. If primary memory cells connected with the primary data bus DB1 or DB2 are determined to be defective, the defective data bus is replaced with the redundant data bus DB3. Therefore, the defective primary memory cells are replaced with redundant memory cells, connected with the redundant data bus DB3.

The read amplifier circuit 78 is connected at an input terminal to the node N14, and at an output terminal to a node N16. The other read amplifier circuit 80 is connected at an input terminal to the node N15, and at an output terminal to a node N17.

The PMOS transistor 52 is connected at a drain to the node N16, at a source to a node N20, and at a gate to a node N18. The NMOS transistor 64 is connected at a drain to the node N16, at a source to the node N20, and at a gate to a node N19. The PMOS transistor 54 is connected at a drain to the node N17, at a source to the node N20, and at a gate to the node N19. The NMOS transistor 66 is connected at a drain to the node N17, at a source to the node N20, and at a gate to the node N18. The inverter 76 is connected at an input terminal to the node N18, and at an output terminal to the node N19. The output buffer circuit 82 is connected at an input terminal to the node N20.

Now the operation of the above described conventional redundant circuit is described. Assuming that the primary data bus DB2 is determined to be defective and is to be replaced with the redundant data bus DB3. First, the programmable fuse 84 is broken by, for example, a laser. When the node N21 turns from low "L" to high "H" in response to an external address signal, the node N10 turns from high "H" to low "L". As the programmable fuse 84 is broken, no signal is supplied to the node N9, and therefore, the node N8 keeps being at high state "H" and the node N11 keeps being at low state "L". The PMOS transistor 40 keeps being in on state.

When the node N9 turns to low "L", the node N13 turns to high "H", the PMOS transistor 50 and the NMOS transistor 62 turn on and the PMOS transistor 48 and NMOS transistor 60 turn off. As a result, the primary data bus DB1 is electrically connected to the node N15, and data are transmitted through them.

If the programmable fuse 84 is not broken, the node N8 is low "L", the node N12 is high "H", the PMOS transistor 46 and NMOS transistor 58 are in on state, and the PMOS transistor 42 and NMOS transistor 56 are in off state. Therefore, the primary data bus DB2 is electrically connected to the node N14, and data are transmitted through them.

As the programmable fuse 84 is broken and the node N8 keeps being at high "H", the node N12 is low "L" in level, the PMOS transistor 46 and NMOS transistor 58 are in off state, and the PMOS transistor 42 and NMOS transistor 56 are in on state. Therefore, the redundant data bus DB3 is electrically connected to the node N14, and data are transmitted through them. In other words, the primary data bus DB2 is replaced with the redundant data bus DB3.

When data are supplied through the nodes N14 and N15 into the read amplifier circuits 78 and 80, the data are amplified and supplied to the nodes N16 and N17, respectively. When the node N18 turns to high "H" in response to an external address signal, the node N19 turns to low "L", so that the node N17 is electrically connected to the node N20. As a result, data supplied from the read amplifier circuit 80 are transmitted to the output buffer circuit 82.

According to the above described redundant circuit, shown in FIG. 2, if one of the read amplifier circuits 78 and 80 is determined to be defective, the redundant circuit does not work. That is because, the read amplifier circuit 78 is used both for the data buses DB2 and DB3, and the read amplifier circuit 80 is used both for the data buses DB1 and DB2. As a result, the production yield (wafer yield) becomes low. The production yield is defined as the ratio of non-defective chips and the total chips fabricated on a given wafer.

Figure 3:
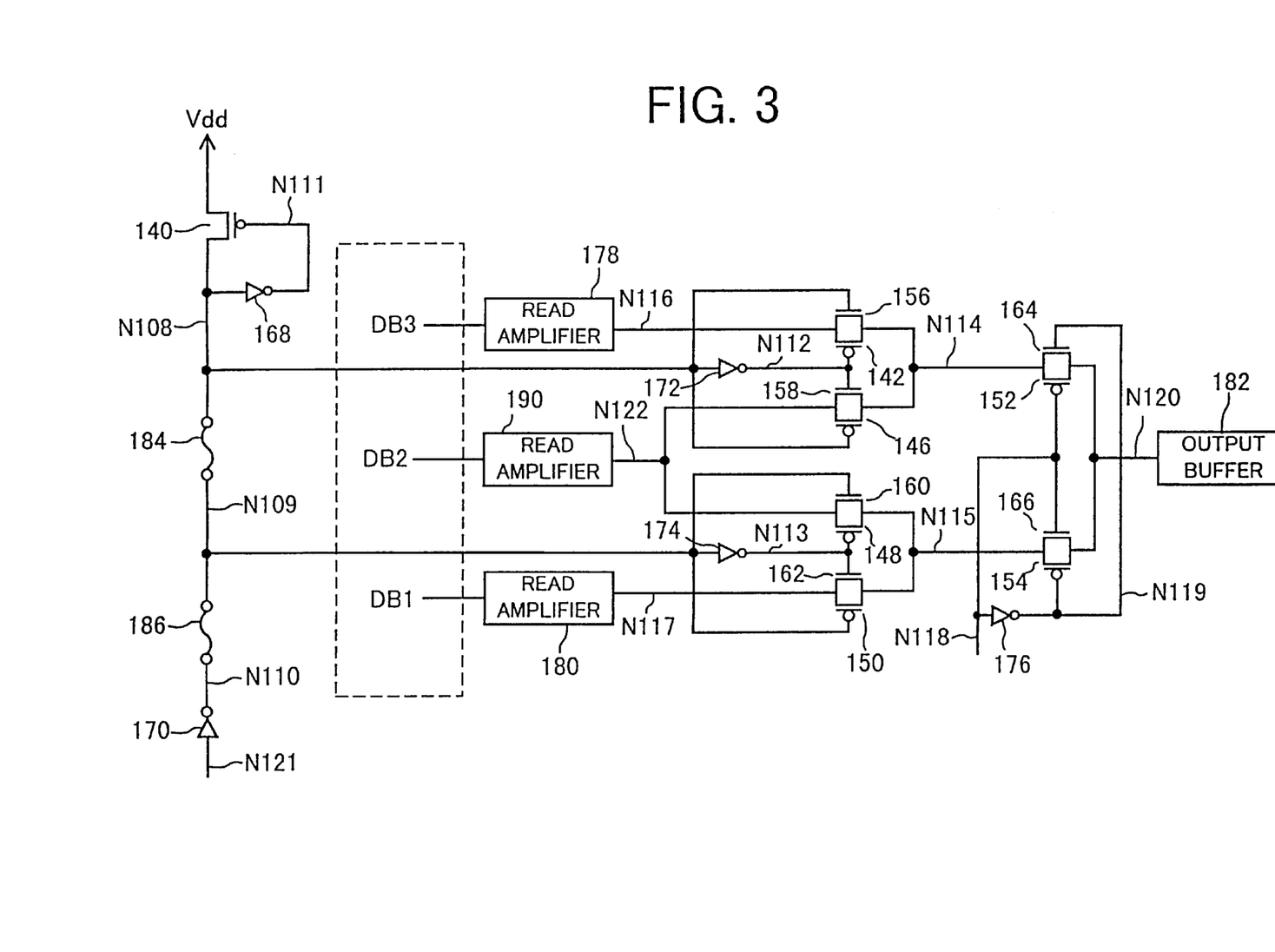
FIG. 3 is a block diagram illustrating a column redundant circuit for reading operation in a semiconductor memory, according to a first preferred embodiment of the present invention.

FIG. 3 shows a column redundant circuit for reading operation, which is used in a semiconductor memory chip, according to a first preferred embodiment of the present invention. Although, data buses (DB and DBb) are practically used as a pair in the semiconductor memory as shown in FIG. 1, they are shown as a single data bus (DB1–DB3) in FIG. 3 for easy understanding. In FIG. 3, a memory array is surrounded with a broken line.

The redundant circuit includes PMOS transistors 140, 142, 146, 148, 150, 152 and 154; NMOS transistors 156, 158, 160, 162, 164 and 166; inverters 168, 170, 172, 174 and 176; programmable fuses 184 and 186; read amplifier circuits 178, 180 and 190; and an output buffer circuit 182. In FIG. 3, data buses DB1 and DB2 are used as primary data buses that are connected to primary memory cells, while the data bus DB3 is used as a redundant data bus that is connected to redundant memory cells.

The PMOS transistor 140 is connected at a source to a node N108, and at a gate to a node N111. The PMOS transistor 140 is applied at a drain with a power supply voltage Vdd. The inverter 168 is connected at an input terminal to the node N108 and at an output terminal to the node N111. The programmable fuse 184 is connected between the node N108 and a node N109. The programmable fuse 186 is connected between the node N109 and a node N110. The inverter 170 is connected at an input terminal to a node N121 and at an output terminal to the node N110.

The PMOS transistor 142 is connected at a drain to a node N116, at a source to a node N114, and at a gate to a node N112. The inverter 172 is connected at an input terminal to the node N108, and at an output terminal to the node N112. The NMOS transistor 156 is connected at a drain to the node N116, at a source to the node N114, and at a gate to the node N108. The PMOS transistor 146 is connected at a drain to a node N122, at a source to the node N114, and at a gate to the node N108. The NMOS transistor 158 is connected at a drain to the node N122, at a source to the node N114, and at a gate to the node N112.

The PMOS transistor 148 is connected at a drain to the node N122, at a source to a node N115, and at a gate to a node N113. The inverter 174 is connected at an input terminal to the node N109, and at an output terminal to the node N113. The NMOS transistor 160 is connected at a drain to the node N122, at a source to the node N115, and at a gate to the node N109. The PMOS transistor 150 is connected at a drain to a node N117, at a source to the node N115, and at a gate to the node N109. The NMOS transistor 162 is connected at a drain to the node N117, at a source to the node N115, and at a gate to the node N113.

In normal operation, the primary data buses DB1 and DB2 are used, but the redundant data bus DB3 is not used. If primary memory cells connected with the primary data bus DB1 or DB2 are determined to be defective, the defective data bus is replaced with the redundant data bus DB3. Therefore, the defective primary memory cells are replaced with redundant memory cells, connected with the redundant data bus DB3.

The read amplifier circuit 178 is connected at an input terminal to the redundant data bus DB3, and at an output terminal to the node N116. The read amplifier circuit 180 is connected at an input terminal to the primary data bus DB1, and at an output terminal to the node N117. The read amplifier circuit 190 is connected at an input terminal to the primary data bus DB2, and at an output terminal to the node N122.

The PMOS transistor 152 is connected at a drain to the node N114, at a source to a node N120, and at a gate to a node N118. The NMOS transistor 164 is connected at a drain to the node N114, at a source to the node N120, and at a gate to a node N119. The PMOS transistor 154 is connected at a drain to the node N115, at a source to the node N120, and at a gate to the node N119. The NMOS transistor 166 is connected at a drain to the node N115, at a source to the node N120, and at a gate to the node N118. The inverter 176 is connected at an input terminal to the node N118, and at an output terminal to the node N119. The output buffer circuit 182 is connected at an input terminal to the node N120.

Now the operation of the above described redundant circuit is described. Assuming that the primary data bus DB2 is determined to be defective and is to be replaced with the redundant data bus DB3. First, the programmable fuse 184 is broken by, for example, a laser. When the node N121 turns from low "L" to high "H" in response to an external address signal, the node N110 turns from high "H" to low "L". As the programmable fuse 184 is broken, no signal is supplied to the node N109, and therefore, the node N108 keeps being at high state "H" and the node N111 keeps being at low state "L". The PMOS transistor 140 keeps being in on state.

When the node N109 turns to low "L", the node N113 turns to high "H", the PMOS transistor 150 and the NMOS transistor 162 turn on and the PMOS transistor 148 and NMOS transistor 160 turn off. The read amplifier circuit 180 amplifies data supplied from the primary data bus DB1 and supplies the amplified data to the node N117. As the PMOS transistor 150 and NMOS transistor 162 are on, the node N117 and node N115 are electrically connected to each other. As a result, the data are transmitted through the nodes N117 and N115.

If the programmable fuse 184 is not broken, the node N108 is low "L", the node N112 is high "H", the PMOS transistor 146 and NMOS transistor 158 are in on state, and the PMOS transistor 142 and NMOS transistor 156 are in off state. The read amplifier circuit 190 amplifies data transmitted from the primary data bus DB2, and supplied to the node N122. As the PMOS transistor 146 and NMOS transistor 158 are on, the node N122 is electrically connected to the node N114. As a result, the data, supplied from the read amplifier circuit 190, are transmitted through the nodes N122 and N114.

In this embodiment, as the programmable fuse 184 is broken and the node N108 keeps high "H", the node N112 is low "L", the PMOS transistor 146 and NMOS transistor 158 are in off state, and the PMOS transistor 142 and NMOS transistor 156 are in on state. Therefore, the node N116 is electrically connected to the node N114, and data, supplied from the read amplifier circuit 178, are transmitted through the nodes N116 and N114. In other words, the primary data bus DB2 is replaced with the redundant data bus DB3. The read amplifier circuit 178 amplifies the data transmitted from the redundant data bus DB3 and supplies the amplified data to the node N116.

When the node N118 turns to high "H" in response to an external address signal, the node N119 turns to low "L", so that the PMOS transistor 154 and NMOS transistor 166 turn on. As a result, the node N115 is electrically connected with the node N120, and the data supplied from the read amplifier circuit 180 are transmitted to the output buffer circuit 182.

According to the above described redundant circuit, shown in FIG. 3, the read amplifier circuit 190 is replaced with the read amplifier circuit 178 as well when some elements connected with the primary data bus DB2 are determined to be defective. Therefore, even if the read amplifier circuit 178 is determined to be defective, the redundant circuit still works. That makes the production yield (wafer yield) high. The production yield is defined as the ratio of non-defective chips and the total chips fabricated on a given wafer.

Figure 4:
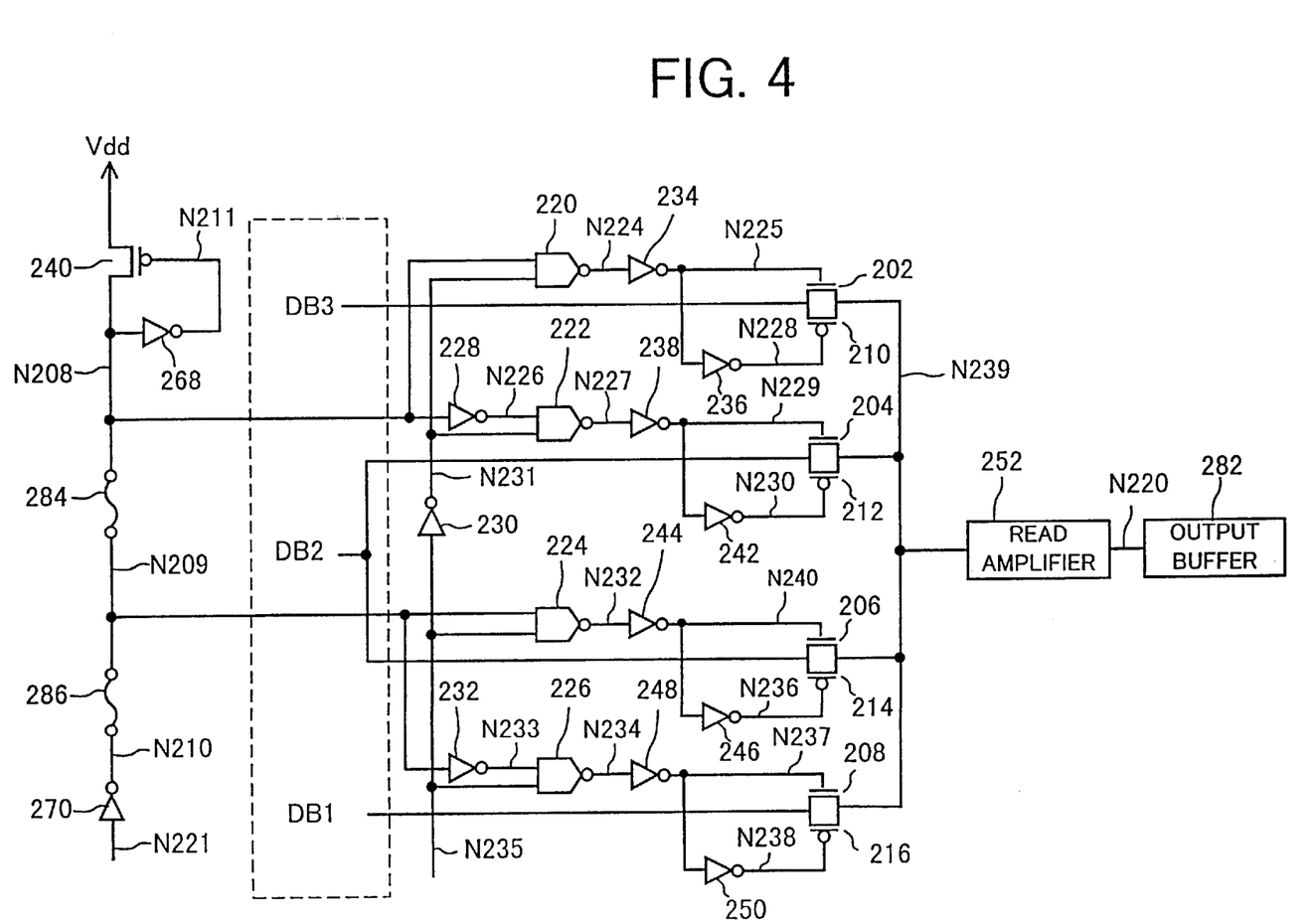
FIG. 4 is a block diagram illustrating a column redundant circuit for reading operation in a semiconductor memory, according to a second preferred embodiment of the present invention.

FIG. 4 shows a column redundant circuit for reading operation, which is used in a semiconductor memory chip, according to a second preferred embodiment of the present invention. Although, data buses (DB and DBb) are practically used as a pair in the semiconductor memory as shown in FIG. 1, they are shown as a single data bus (DB1–DB3) in FIG. 4 for easy understanding of the embodiment. In FIG. 4, a memory array is surrounded with a broken line.

The redundant circuit includes PMOS transistors 240, 210, 212, 214 and 216; NMOS transistors 202, 204, 206 and 208; inverters 268, 270, 228, 230, 232, 234, 236, 238, 242, 244, 246, 248 and 250; NAND gates 220, 222, 224 and 226; a read amplifier circuit 252; an output buffer circuit 282; and programmable fuses 284 and 286. In FIG. 4, data buses DB1 and DB2 are used as primary data buses that are connected to primary memory cells, while the data bus DB3 is used as a redundant data bus that is connected to redundant memory cells.

The PMOS transistor 240 is connected at a source to a node N208, and at a gate to a node N211. The PMOS transistor 240 is applied at a drain with a power supply voltage Vdd. The inverter 268 is connected at an input terminal to the node N208 and at an output terminal to the node N211. The programmable fuse 284 is connected between the node N208 and a node N209. The programmable fuse 286 is connected between the node N209 and a node N210. The inverter 270 is connected at an input terminal to a node N221 and at an output terminal to the node N210.

The NAND gate 220 is connected at input terminals to the node N208 and a node N231, and at an output terminal to a node N224. The inverter 234 is connected at an input terminal to the node N224 and at an output terminal to a node N225. The inverter 236 is connected at an input terminal to the node N225 and at an output terminal to a node N228. The NMOS transistor 202 is connected at a drain to a redundant data bus DB3, at a source to a node N239, and at a gate to the node N225. The PMOS transistor 210 is connected at a drain to the redundant data bus DB3, at a source to the node 239 and at a gate to the node N228.

The inverter 228 is connected at an input terminal to the node N208 and at an output terminal to a node N226. The NAND gate 222 is connected at input terminals to the nodes N226 and N231, and at an output terminal to a node N227. The inverter 238 is connected at an input terminal to the node N227 and at an output terminal to a node N229. The inverter 242 is connected at an input terminal to the node N229 and at an output terminal to a node N230. The NMOS transistor 204 is connected at a drain to the primary data bus DB2, at a source to the node N239, and at a gate to the node N229. The PMOS transistor 212 is connected at a drain to the primary data bus DB2, at a source to the node 239 and at a gate to the node N230.

The NAND gate 224 is connected at input terminals to the node N209 and a node N235, and at an output terminal to a node N232. The inverter 244 is connected at an input terminal to the node N232 and at an output terminal to a node N240. The inverter 246 is connected at an input terminal to the node N240 and at an output terminal to a node N236. The NMOS transistor 206 is connected at a drain to the primary data bus DB2, at a source to a node N239, and at a gate to the node N240. The PMOS transistor 214 is connected at a drain to the primary data bus DB2, at a source to the node 239 and at a gate to the node N236.

The inverter 232 is connected at an input terminal to the node N209 and at an output terminal to a node N233. The NAND gate 226 is connected at input terminals to the nodes N233 and N235, and at an output terminal to a node N234. The inverter 248 is connected at an input terminal to the node N234 and at an output terminal to a node N237. The inverter 250 is connected at an input terminal to the node N237 and at an output terminal to a node N238. The NMOS transistor 208 is connected at a drain to the primary data bus DB1, at a source to the node N239, and at a gate to the node N237. The PMOS transistor 216 is connected at a drain to the primary data bus DB1, at a source to the node 239 and at a gate to the node N238.

The read amplifier circuit 252 is connected at an input terminal to the node N239 and at an output terminal to a node N220. The output buffer circuit 282 is connected at an input terminal to the node N220.

Now the operation of the above described redundant circuit is described. Assuming that the primary data bus DB2 is determined to be defective and is to be replaced with the redundant data bus DB3. First, the programmable fuse 284 is broken by, for example, a laser. When the node N221 turns from low "L" to high "H" in response to an address signal, the node N210 turns from high "H" to low "L". As the programmable fuse 284 is broken, no signal is supplied to the node N209, and therefore, the node N208 keeps being at high state "H" and the node N211 keeps being at low state "L". The PMOS transistor 240 keeps being in on state.

When the node N209 turns to low "L", the node N233 turns to high "H". When the node N235 is high "H", the NAND gate 226 is supplied with two high level signals. As a result, the node N234 turns to low "L", the node N237 turns to high "H", the node N238 turns to low "L", and each of the PMOS transistor 216 and NMOS transistor 208 turns on. Therefore, the primary data bus DB1 is electrically connected to the node N239, so that data are transmitted from the primary data bus DB1 through the node N239 to the read amplifier circuit 252.

As the node N209 is in low state "L", the node N232 turns to high "H"; the node N240 turns to low "L"; and the node N236 turns to high "H". As a result, both the PMOS transistor 214 and NMOS transistor 206 tun off. As the node N231 is low "L", each of the NAND gates 220 and 222 supplies an output signal of high "H" regardless of the other input signal. As a result, both the nodes N224 and N227 turn to high "H"; both the nodes N225 and N229 turn to low "L"; and both the nodes N228 and N230 turn to high "H". Therefore, the all of the PMOS transistors 210 and 212 and the NMOS transistors 202 and 204 turn off.

The read amplifier circuit 252 amplifies the data transmitted from the primary data bus DB1 and supplies the data to the node N220. The output buffer circuit 282 outputs the data, supplied through the node N220, outside the memory chip.

When the node N235 turns to low "L" in response to an address signal, each of the NAND gates 224 and 226 supplies an output signal of high level "H" regardless of the other input signal. As a result, both the nodes N232 and N234 turn to high "H"; both the nodes N237 and N240 turn to low "L"; and both the nodes N236 and N238 turn to high "H". Therefore, the all of the PMOS transistors 214 and 216 and the NMOS transistors 206 and 208 turn off.

If the programmable fuse 284 were not broken, the node N208 would be low "L"; the node N226 would be high "H"; and the node N231 would be high "H". As a result, the node N227 turns to low "L" and the node N224 turns to high "H". When the node N229 turns to high "H" and the node N230 turns to low "L", both the PMOS transistor 212 and NMOS transistor 204 turn on. When the PMOS transistor 212 and NMOS transistor 204 turn on, the node N225 turns to low "L" and the node N228 turns to high "H", so that both the PMOS transistor 210 and NMOS transistor 202 turn off. As a result, the primary data bus DB2 is electrically connected to the node N239, and therefore, data supplied from the primary data bus DB2 are transmitted through the read amplifier circuit 252 and the output buffer circuit 282.

As the programmable fuse is broken, the node N208 keeps being in high state "H". The node N226 turns to low "L" and the node N231 turns to high "H", so that the node N227 turns to high "H" and the node N224 turns to low "L". When the node N229 turns to low "L" and the node N230 turns to high "H", both the PMOS transistor 212 and NMOS transistor 204 turn off; and therefore the node N225 turns to high "H" and the N228 turns to low "L". As a result, both the PMOS transistor 210 and NMOS transistor 202 turn on, and the redundant data bus DB3 is electrically connected to the node N239.

Data supplied from the redundant data bus DB3 are transmitted through the read amplifier circuit 252 and output buffer circuit 282. That means that the primary data bus DB2 is replaced with the redundant data bus DB3. The read amplifier circuit 252 amplifies data transmitted from the redundant data bus DB3, and supplied to the node N220. The output buffer circuit 282 outputs the data transmitted through the node N220.

According to the above described redundant circuit, shown in FIG. 4, a data bus is selected to be connected to the read amplifier circuit 252 in response to an external address signal, so that the read amplifier circuit 252 can be used for all the data buses DB1, DB2 and DB3. As a result, the number of read amplifier circuits can be reduced, and therefore, the possibility of occurrence of defective products can be decreased. Further, power consumption of the memory chip can be decreased.

REDUNDANT CIRCUIT FOR WRITING OPERATION

Figure 5:
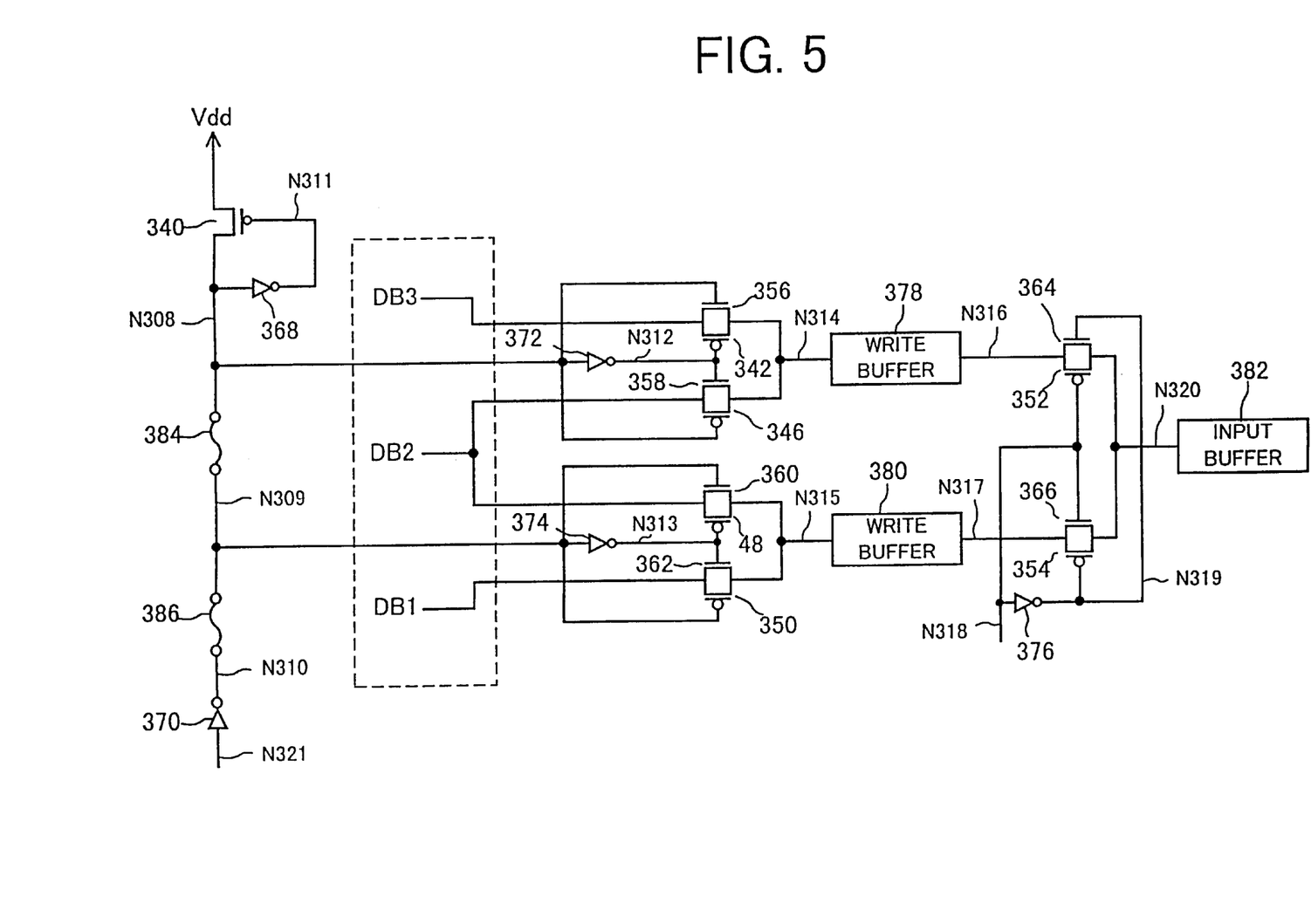
FIG. 5 is a block diagram illustrating a conventional column-redundant circuit for writing operation in a semiconductor memory.

FIG. 5 shows a conventional column redundant circuit for writing operation, which is used in a semiconductor memory chip. Although, in general, as shown in FIG. 1, a pair of data buses (DB and DBb) is used in the memory chip, only one data bus (DB1) is shown in FIG. 5 for easy understanding. In FIG. 5, a memory array is surrounded with a broken line.

The conventional redundant circuit, for writing operation, includes PMOS transistors 340, 342, 346, 348, 350, 352 and 354; NMOS transistors 356, 358, 360, 362, 364 and 366; inverters 368, 370, 372, 374 and 376; programmable fuses 384 and 386; write buffer circuits 378 and 380; and an output buffer circuit 382. In FIG. 5, data buses DB1 and DB2 are used as primary data buses that are connected to primary memory cells, while the data bus DB3 is used as a redundant data bus that is connected to redundant memory cells.

The PMOS transistor 340 is connected at a source to a node N308, and at a gate to a node N311. The PMOS transistor 340 is applied at a drain with a power supply voltage Vdd. The inverter 368 is connected at an input terminal to the node N308 and at an output terminal to the node N311. The programmable fuse 384 is connected between the node 308 and a node 309. The programmable fuse 386 is connected between the node N309 and a node N310. The inverter 370 is connected at an input terminal to a node N321 and at an output terminal to the node N310.

The PMOS transistor 342 is connected at a drain to the redundant data bus DB3, at a source to a node N314, and at a gate to a node N312. The inverter 372 is connected at an input terminal to the node N308, and at an output terminal to the node N312. The NMOS transistor 356 is connected at a drain to the redundant data bus DB3, at a source to the node N314, and at a gate to the node N308. The PMOS transistor 346 is connected at a drain to the primary data bus DB2, at a source to the node N314, and at a gate to the node N308. The NMOS transistor 358 is connected at a drain to the primary data bus DB2, at a source to the node N314, and at a gate to the node N312.

The PMOS transistor 348 is connected at a drain to the primary data bus DB2, at a source to a node N315, and at a gate to a node N313. The inverter 374 is connected at an input terminal to the node N309, and at an output terminal to the node N313. The NMOS transistor 360 is connected at a drain to the primary data bus DB2, at a source to the node N315, and at a gate to the node N309. The PMOS transistor 350 is connected at a drain to the primary data bus DB1, at a source to the node N315, and at a gate to the node N309. The NMOS transistor 362 is connected at a drain to the primary data bus DB1, at a source to the node N315, and at a gate to the node N313.

In normal operation, the primary data buses DB1 and DB2 are used, but the redundant data bus DB3 is not used. If primary memory cells connected with the primary data bus DB1 or DB2 are determined to be defective, the defective data bus is replaced with the redundant data bus DB3. Therefore, the defective primary memory cells are replaced with redundant memory cells, connected with the redundant data bus DB3.

The write buffer circuit 378 is connected at an input terminal to a node N316, and at an output terminal to the node N314. The other write buffer circuit 380 is connected at an input terminal to a node N317, and at an output terminal to the node N315.

The PMOS transistor 352 is connected at a drain to the node N316, at a source to a node N320, and at a gate to a node N318. The NMOS transistor 364 is connected at a drain to the node N316, at a source to the node N320, and at a gate to a node N319. The PMOS transistor 354 is connected at a drain to the node N317, at a source to the node N320, and at a gate to the node N319. The NMOS transistor 366 is connected at a drain to the node N317, at a source to the node N320, and at a gate to the node N318. The inverter 376 is connected at an input terminal to the node N318, and at an output terminal to the node N319. The input buffer circuit 382 is connected at an output terminal to the node N320.

Now the operation of the above described redundant circuit is described. Assuming that the primary data bus DB2 is determined to be defective and is to be replaced with the redundant data bus DB3. First, the programmable fuse 384 is broken by, for example, a laser. When the node N321 turns from low "L" to high "H" in response to an address signal, the node N310 turns from high "H" to low "L". As the programmable fuse 384 is broken, no signal is supplied to the node N309, and therefore, the node N308 keeps being at high state "H" and the node N311 keeps being at low state "L". The PMOS transistor 340 keeps being in on state.

When the node N309 turns to low "L", the node N313 turns to high "H", the PMOS transistor 350 and the NMOS transistor 362 turn on and the PMOS transistor 348 and NMOS transistor 360 turn off. As a result, the primary data bus DB1 is electrically connected to the node N315, and data are transmitted through them.

If the programmable fuse 384 is not broken, the node N308 is low "L", the node N312 is high "H", the PMOS transistor 346 and NMOS transistor 358 are in on state, and the PMOS transistor 342 and NMOS transistor 356 are in off state. Therefore, the primary data bus DB2 is electrically connected to the node N314, and data are transmitted through them.

As the programmable fuse 384 is broken and the node N308 keeps being at high "H", the node N312 is low "L" in level, the PMOS transistor 346 and NMOS transistor 358 are in off state, and the PMOS transistor 342 and NMOS transistor 356 are in on state. Therefore, the redundant data bus DB3 is electrically connected to the node N315, and data are transmitted through them. In other words, the primary data bus DB2 is replaced with the redundant data bus DB3.

When the node N318 turns to low "L" in response to an address signal, the node N319 turns to high "H", so that the PMOS transistor 352 and NMOS transistor 364 turn on. As a result, the PMOS transistor 354 and NMOS transistor 366 turn off, and the node N316 is electrically connected to the node N320. The input buffer circuit 382 transmits data, supplied from an outside circuit, to the write buffer circuit 378 through the node N320. The write buffer circuit 378 supplies the data to the redundant data bus DB3 through the node N314.

According to the above described conventional redundant circuit, shown in FIG. 5, if one of the write buffer circuits 378 and 380 is determined to be defective, the redundant circuit does not work anymore. That is because, the write buffer circuit 378 is used both for the data buses DB2 and DB3, and the write buffer circuit 380 is used both for the data buses DB1 and DB2. As a result, the production yield (wafer yield) becomes low. The production yield is defined as the ratio of non-defective chips and the total chips fabricated on a given wafer.

Figure 6:
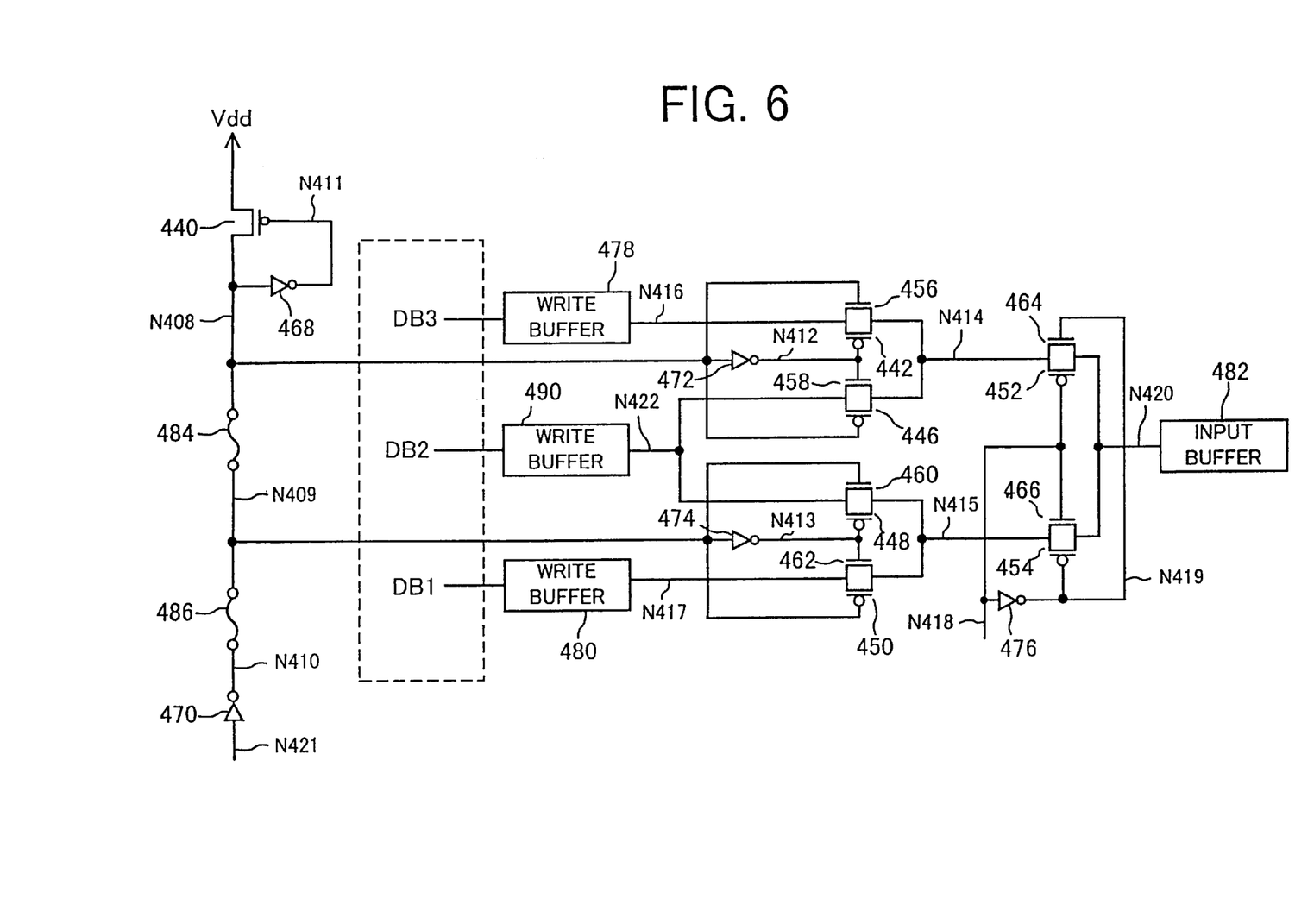
FIG. 6 is a block diagram illustrating a column redundant circuit for writing operation in a semiconductor memory, according to a third preferred embodiment of the present invention.

FIG. 6 shows a column redundant circuit for reading operation, which is used in a semiconductor memory chip, according to a third preferred embodiment of the present invention. Although, data buses (DB and DBb) are practically used as a pair in the semiconductor memory as shown in FIG. 1, they are shown as a single data bus (DB1–DB3) in FIG. 6 for easy understanding of the embodiment. In FIG. 6, a memory array is surrounded with a broken line.

The redundant circuit includes PMOS transistors 440, 442, 446, 448, 450, 452 and 454; NMOS transistors 456, 458, 460, 462, 464 and 466; inverters 468, 470, 472, 474 and 476; programmable fuses 484 and 486; write buffer circuits 478, 480 and 490; and an input buffer circuit 482. In FIG. 6, data buses DB1 and DB2 are used as primary data buses that are connected to primary memory cells, while the data bus DB3 is used as a redundant data bus that is connected to redundant memory cells.

The PMOS transistor 440 is connected at a source to a node N408, and at a gate to a node N411. The PMOS transistor 440 is applied at a drain with a power supply voltage Vdd. The inverter 468 is connected at an input terminal to the node N408 and at an output terminal to the node N411. The programmable fuse 484 is connected between the node N408 and a node N409. The programmable fuse 486 is connected between the node N409 and a node N410. The inverter 470 is connected at an input terminal to a node N421 and at an output terminal to the node N410.

The PMOS transistor 442 is connected at a drain to a node N416, at a source to a node N414, and at a gate to a node N412. The inverter 472 is connected at an input terminal to the node N408, and at an output terminal to the node N412. The NMOS transistor 456 is connected at a drain to the node N416, at a source to the node N414, and at a gate to the node N408. The PMOS transistor 446 is connected at a drain to a node N422, at a source to the node N414, and at a gate to the node N408. The NMOS transistor 458 is connected at a drain to the node N422, at a source to the node N414, and at a gate to the node N412.

The PMOS transistor 448 is connected at a drain to the node N422, at a source to a node N415, and at a gate to a node N413. The inverter 474 is connected at an input terminal to the node N409, and at an output terminal to the node N413. The NMOS transistor 460 is connected at a drain to the node N422, at a source to the node N415, and at a gate to the node N409. The PMOS transistor 450 is connected at a drain to a node N417, at a source to the node N415, and at a gate to the node N409. The NMOS transistor 462 is connected at a drain to the node N417, at a source to the node N415, and at a gate to the node N413.

In normal operation, the primary data buses DB1 and DB2 are used, but the redundant data bus DB3 is not used. If primary memory cells connected with the primary data bus DB1 or DB2 are determined to be defective, the defective data bus is replaced with the redundant data bus DB3. Therefore, the defective primary memory cells are replaced with redundant memory cells, connected with the redundant data bus DB3.

The write buffer circuit 478 is connected at an input terminal to the node N416 and at an output terminal to the redundant data bus DB3. The write buffer circuit 480 is connected at an input terminal to the node N417 and at an output terminal to the primary data bus DB1. The write buffer circuit 490 is connected at an input terminal to the node N422 and at an output terminal to the primary data bus DB2.

The PMOS transistor 452 is connected at a drain to the node N414, at a source to a node N420, and at a gate to a node N418. The NMOS transistor 464 is connected at a drain to the node N414, at a source to the node N420, and at a gate to a node N419. The PMOS transistor 454 is connected at a drain to the node N415, at a source to the node N420, and at a gate to the node N419. The NMOS transistor 466 is connected at a drain to the node N415, at a source to the node N420, and at a gate to the node N418. The inverter 476 is connected at an input terminal to the node N418, and at an output terminal to the node N419. The input buffer circuit 482 is connected at an output terminal to the node N420.

Now the operation of the above described redundant circuit is described. Assuming that the primary data bus DB2 is determined to be defective and is to be replaced with the redundant data bus DB3. First, the programmable fuse 484 is broken by, for example, a laser. When the node N421 turns from low "L" to high "H" in response to an address signal, the node N410 turns from high "H" to low "L". As the programmable fuse 484 is broken, no signal is supplied to the node N409, and therefore, the node N408 keeps being at high state "H" and the node N411 keeps being at low state "L". The PMOS transistor 440 keeps being in on state.

When the node N409 turns to low "L", the node N413 turns to high "H", the PMOS transistor 450 and the NMOS transistor 462 turn on and the PMOS transistor 448 and NMOS transistor 460 turn off. As a result, the node N417 is electrically connected to the node N415.

If the programmable fuse 484 is not broken, the node N408 is low "L", the node N412 is high "H", the PMOS transistor 446 and NMOS transistor 458 are in on state, and the PMOS transistor 442 and NMOS transistor 456 are in off state. As a result, the node N422 is electrically connected to the node N414.

In this embodiment, the programmable fuse 484 is broken, so that the node N408 keeps being at high "H", the node N412 is low "L", the PMOS transistor 446 and NMOS transistor 458 are in off state, and the PMOS transistor 442 and NMOS transistor 456 are in on state. As a result, the node N416 is electrically connected to the node N414, and therefore, the primary data bus DB2 is replaced with the redundant data bus DB3.

When the node N418 turns to low "L" in response to an address signal, the node N419 turns to high "H". As a result, the PMOS transistor 452 and NMOS transistor 462 turn on while the PMOS transistor 454 and NMOS transistor 466 turn off. Therefore, the node N414 is electrically connected with the node N420. The input buffer circuit 482 transmits data, supplied from an outside circuit, to the write buffer circuit 478 through the nodes N420 and N414. The write buffer circuit 478 transmits the received data to the redundant data bus DB3.

According to the above described redundant circuit, shown in FIG. 6, the write buffer circuit 490 is replaced with the write buffer circuit 478 as well when some elements connected with the primary data bus DB2 are determined to be defective. Therefore, even if the write buffer circuit 478 is determined to be defective, the redundant circuit still works. That makes the production yield (wafer yield) high. The production yield is defined as the ratio of non-defective chips and the total chips fabricated on a given wafer.

Figure 7:
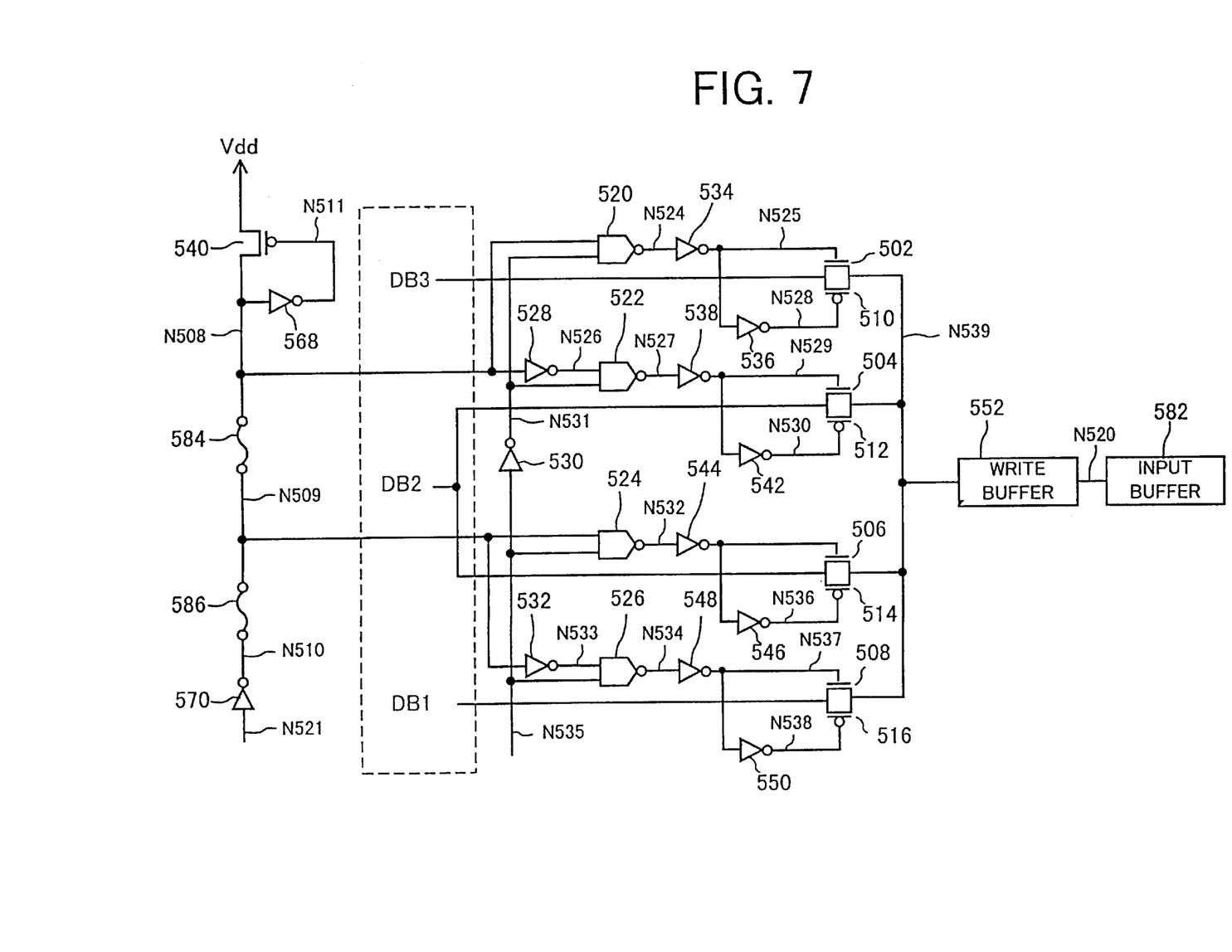
FIG. 7 is a block diagram illustrating a column redundant circuit for writing operation in a semiconductor memory, according to a fourth preferred embodiment of the present invention.

FIG. 7 shows a column redundant circuit for writing operation, which is used in a semiconductor memory chip, according to a fourth preferred embodiment of the present invention. Although, data buses (DB and DBb) are practically used as a pair in the semiconductor memory as shown in FIG. 1, they are shown as a single data bus (DB1–DB3) in FIG. 7 for easy understanding of the embodiment. In FIG. 7, a memory array is surrounded with a broken line.

The redundant circuit includes PMOS transistors 540, 510, 512, 514 and 516; NMOS transistors 502, 504, 506 and 508; inverters 568, 570, 528, 530, 532, 534, 536, 538, 542, 544, 546, 548 and 550; NAND gates 520, 522, 524 and 526; a write buffer circuit 552; an input buffer circuit 582; and programmable fuses 584 and 586. In FIG. 7, data buses DB1 and DB2 are used as primary data buses that are connected to primary memory cells, while the data bus DB3 is used as a redundant data bus that is connected to redundant memory cells.

The PMOS transistor 540 is connected at a source to a node N508, and at a gate to a node N511. The PMOS transistor 540 is applied at a drain with a power supply voltage Vdd. The inverter 568 is connected at an input terminal to the node N508 and at an output terminal to the node N511. The programmable fuse 584 is connected between the node N508 and a node N509. The programmable fuse 586 is connected between the node N509 and a node NS10. The inverter 570 is connected at an input terminal to a node N521 and at an output terminal to the node N510.

The NAND gate 520 is connected at input terminals to the node N508 and a node N531, and at an output terminal to a node N524. The inverter 534 is connected at an input terminal to the node N524 and at an output terminal to a node N525. The inverter 536 is connected at an input terminal to the node N525 and at an output terminal to a node N528. The NMOS transistor 502 is connected at a drain to the redundant data bus DB3, at a source to a node N539, and at a gate to the node N525. The PMOS transistor 510 is connected at a drain to the redundant data bus DB3, at a source to the node 539 and at a gate to the node N528.

The inverter 528 is connected at an input terminal to the node N508 and at an output terminal to a node N526. The NAND gate 522 is connected at input terminals to the nodes N526 and N531, and at an output terminal to a node N527. The inverter 538 is connected at an input terminal to the node N527 and at an output terminal to a node N529. The inverter 542 is connected at an input terminal to the node N529 and at an output terminal to a node N530. The NMOS transistor 504 is connected at a drain to the primary data bus DB2, at a source to the node N539, and at a gate to the node N529. The PMOS transistor 512 is connected at a drain to the primary data bus DB2, at a source to the node 539 and at a gate to the node N530.

The NAND gate 524 is connected at input terminals to the node N509 and a node N535, and at an output terminal to a node N532. The inverter 544 is connected at an input terminal to the node N532 and at an output terminal to a node N540. The inverter 546 is connected at an input terminal to the node N540 and at an output terminal to a node N536. The NMOS transistor 506 is connected at a drain to the primary data bus DB2, at a source to a node N539, and at a gate to the node N540. The PMOS transistor 514 is connected at a drain to the primary data bus DB2, at a source to the node 539 and at a gate to the node N536.

The inverter 532 is connected at an input terminal to the node N509 and at an output terminal to a node N533. The NAND gate 526 is connected at input terminals to the nodes N533 and N535, and at an output terminal to a node N534. The inverter 548 is connected at an input terminal to the node N534 and at an output terminal to a node N537. The inverter 550 is connected at an input terminal to the node N537 and at an output terminal to a node N538. The NMOS transistor 508 is connected at a drain to the primary data bus DB1, at a source to the node N539, and at a gate to the node N537. The PMOS transistor 516 is connected at a drain to the primary data bus DB1, at a source to the node 539 and at a gate to the node N538.

The write buffer circuit 552 is connected at an input terminal to a node N520 and at an output terminal to the node N539. The input buffer circuit 582 is connected at an output terminal to the node N520.

Now the operation of the above described redundant circuit is described. Assuming that the primary data bus DB2 is determined to be defective and is to be replaced with the redundant data bus DB3. First, the programmable fuse 584 is broken by, for example, a laser. When the node N521 turns from low "L" to high "H" in response to an address signal, the node N510 turns from high "H" to low "L". As the programmable fuse 584 is broken, no signal is supplied to the node N509, and therefore, the node N508 keeps being at high state "H" and the node N511 keeps being at low state "L". The PMOS transistor 540 keeps being in on state.

When the node N509 turns to low "L", the node N533 turns to high "H". When the node N535 is high "H" in accordance with an outer address signal, the NAND gate 526 are supplied with two high level signals. As a result, the node N534 turns to low "L", the node N537 turns to high "H", the node N538 turns to low "L", and each of the PMOS transistor 516 and NMOS transistor 508 turns on. Therefore, the primary data bus DB1 is electrically connected to the node N539, so that data are transmitted between the primary data bus DB1 and the input buffer circuit 582.

As the node N509 is in low state "L", the node N532 turns to high "H"; the node N540 turns to low "L"; and the node N536 turns to high "H". As a result, both the PMOS transistor 514 and NMOS transistor 506 tun off. As the node N531 is at low "L", each of the NAND gates 520 and 522 supplies an output signal of high "H" regardless of the other input signal. As a result, both the nodes N524 and N527 turn to high "H"; both the nodes N525 and N529 turn to low "L"; and both the nodes N528 and N530 turn to high "H". Therefore, the all of the PMOS transistors 510 and 512 and NMOS transistors 502 and 504 turn off.

The input buffer circuit 582 is supplied with data from an output device and transmits the data through the node N520 to the write buffer circuit 552. The write buffer circuit 552 transfer the data, supplied from the input buffer circuit 582, to the node N539. As the primary data bus DB1 is electrically connected with the node N539, the data are transferred to the primary data bus DB1.

When the node N535 turns to low "L" in response to an address signal, each of the NAND gates 524 and 526 supplies an output signal of high level "H" regardless of the other input signal. As a result, both the nodes N532 and N534 turn to high "H"; both the nodes N537 and N540 turn to low "L"; and both the nodes N536 and N538 turn to high "H". Therefore, the all of the PMOS transistors 514 and 516 and NMOS transistors 506 and 508 turn off.

If the programmable fuse 584 were not broken, the node N508 would be low "L"; the node N526 would be high "H"; and the node N531 would be high "H". As a result, the node N527 turns to low "L" and the node N524 turns to high "H". When the node N529 turns to high "H" and the node N530 turns to low "L", both the PMOS transistor 512 and NMOS transistor 504 turn on. When the PMOS transistor 512 and NMOS transistor 504 turn on, the node N525 turns to low "L" and the node N528 turns to high "H", so that both the PMOS transistor 510 and NMOS transistor 502 turn off. As a result, the primary data bus DB2 is electrically connected to the node N539, and therefore, data supplied from the input buffer circuit 582 are transmitted through the write buffer circuit 552 to the primary data bus DB2.

As the programmable fuse is broken, the node N508 keeps being in high state "H". The node N526 turns to low "L" and the node N531 turns to high "H", so that the node N527 turns to high "H" and the node N524 turns to low "L". When the node N529 turns to low "L" and the node N530 turns to high "H", both the PMOS transistor 512 and NMOS transistor 504 turn off; and therefore the node N525 turns to high "H" and the N528 turns to low "L". As a result, both the PMOS transistor 510 and NMOS transistor 502 turn on, and the redundant data bus DB3 is electrically connected to the node N539.

The data supplied from the input buffer circuit 582 are transmitted through the write buffer circuit 552 to the redundant data bus DB3. It means that the defective primary data bus DB2 is replaced with the redundant data bus DB3. The input buffer circuit 582 is supplied with data from an output device and transmits the data through the node N520 to the write buffer circuit 552. The write buffer circuit 552 transfer the data, supplied from the input buffer circuit 582, to the node N539. As the redundant data bus DB3 is electrically connected with the node N539, the data are transferred to the redundant data bus DB3.

According to the above described redundant circuit, shown in FIG. 7, a data bus is selected to be connected to the write buffer circuit 552 in response to an address signal, so that the write buffer circuit 552 can be used for all the data buses DB1, DB2 and DB3. As a result, the number of read amplifier circuits can be reduced, and therefore, the possibility of occurrence of defective products can be decreased. Further, power consumption of the memory chip can be decreased.

It will be understood that the invention is not limited to DRAM's, but can be equally applied to other memory devices, such as video random access memories (VRAM) and static RAM (SRAM). Further, the present invention can be applied to any electronic circuit where primary and redundant circuitry is comprised of separately addressable elements.

Further, in each of the above described embodiments, although three data buses DB1, DB2 and DB3 and two address terminals are used, the number of data buses and the number of address terminals (nodes) are not limited for the present invention. The programmable fuses are preferably laser fuses, but can be any fuse or static state maintaining device. In addition, the present invention can be applied a memory chip in that a read data bus and a write data bus are used in common.

What is claimed is:

1. A semiconductor memory, comprising:
   a memory array in which memory cells are arranged in rows and columns;
   a plurality of data buses, which are connected to the memory array;
   a plurality of data transmission circuits, which are connected to the data buses one by one;
   a buffer circuit, which is connected to an outside device;
   a gate circuit which is arranged between the data transmission circuits and the buffer circuit; and
   a fuse which is connected to the gate circuit, wherein
   the data transmission circuits are selectively connected to the buffer circuit by controlling the fuse and the gate circuit, so that a defective element is replaced with a normal element.

2. A semiconductor memory, according to claim 1, wherein
   the data transmission circuits are read amplifiers, which amplify data transmitted from the data buses; and
   the buffer circuit is an output buffer circuit, which outputs the data transmitted from the read amplifiers to the outside device.

3. A semiconductor memory, according to claim 1, wherein
   the data transmission circuits are write buffers, which temporally store data to be transmitted to the data buses; and
   the buffer circuit is an input buffer circuit, which temporally stores data to be transmitted to the data buses.

4. A semiconductor memory, comprising:
   a memory array in which memory cells are arranged in rows and columns;
   first and second primary data buses, which are connected to the memory array;
   a redundant data bus, which is connected to the memory array;
   a first primary data-transmission circuit, which is connected at one end to the first primary data bus;
   a second primary data-transmission circuit, which is connected at one end to the second primary data bus;
   a redundant data-transmission circuit, which is connected at one end to the redundant data bus;
   a buffer circuit, which is connected to an outside device;
   a gate circuit, which is arranged between the first and second primary data-transmission circuits and redundant data-transmission circuit and the buffer circuit, the gate circuit comprising transistors and inverters; and
   a programmable fuse, which is connected to the gate circuit; wherein
   the redundant data-transmission circuit is connected to the buffer circuit by controlling the programmable fuse and the gate circuit when an element connected to one of the first and second primary data buses is determined to be defective, so that the defective element is replaced with a normal element, connected to the redundant data bus.

5. A semiconductor memory, according to claim 4, wherein
   the data transmission circuits are read amplifiers, which amplify data transmitted from the data buses; and
   the buffer circuit is an output buffer circuit, which outputs the data transmitted from the read amplifiers to the outside device.

6. A semiconductor memory, according to claim 4, wherein
   the data-transmission circuits are write buffers, which temporally store data to be transmitted to the data buses; and
   the buffer circuit is an input buffer circuit, which temporally stores data to be transmitted to the data buses.

7. A semiconductor memory, comprising:
   a memory array in which memory cells are arranged in rows and columns;
   a plurality of data buses, which are connected to the memory array;
   a buffer circuit, which is connected to an outside device;
   a single data transmission circuit, which is connected to the buffer circuit;
   a gate circuit which is arranged between the data transmission circuit and the data buses; and
   a fuse which is connected to the gate circuit, wherein
   the data buses are selectively connected to the data transmission circuit by controlling the fuse and the gate circuit, so that a defective memory cell is replaced with a normal memory cell.

8. A semiconductor memory, according to claim 7, wherein the data transmission circuit is a read amplifier, which amplifies data transmitted from the data buses; and the buffer circuit is an output buffer circuit, which outputs the data transmitted from the read amplifier to the outside device.

9. A semiconductor memory, according to claim 7, wherein the data transmission circuit is a write buffer, which temporally stores data to be transmitted to the data buses; and the buffer circuit is an input buffer circuit, which temporally stores data to be transmitted to the data buses.

10. A semiconductor memory, comprising:

a memory array in which memory cells are arranged in rows and columns;

first and second primary data buses, which are connected to the memory array;

a redundant data bus, which is connected to the memory array;

a buffer circuit, which is connected to an outside device;

a single data-transmission circuit, which is connected at one end to the buffer circuit;

a gate circuit which is arranged between the data transmission circuit and the data buses, the gate circuit comprising transistors, inverters and logic gates; and a programmable fuse, which is connected to the gate circuit; wherein the redundant data bus is connected to the data transmission circuit by controlling the fuse and the gate circuit when a memory cell connected to one of the primary data buses is determined to be defective, so that the defective memory cell is replaced with a normal memory cell, connected with the redundant data bus.

11. A semiconductor memory, according to claim 10, wherein the data transmission circuit is a read amplifier, which amplifies data transmitted from the data buses; and the buffer circuit is an output buffer circuit, which outputs the data transmitted from the read amplifier to the outside device.

12. A semiconductor memory, according to claim 10, wherein the data transmission circuit is a write buffer, which temporally stores data to be transmitted to the data buses; and the buffer circuit is an input buffer circuit, which temporally stores data to be transmitted to the data buses.

13. A redundant circuit used in a semiconductor memory, which comprises a primary data bus connected to primary memory cells; a primary data transmission circuit connected to the primary data bus; and a buffer circuit connected to an outside device, comprising:

redundant memory cells;

a redundant data bus which is connected to the redundant memory cells;

a redundant data transmission circuit, which is connected to the redundant data bus;

a gate circuit which is arranged between the primary data transmission circuit and redundant data transmission circuit and the buffer circuit; and a fuse which is connected to the gate circuit, wherein the redundant data transmission circuit is connected to the buffer circuit by controlling the fuse and the gate circuit when the primary memory cells are determined to be defective, so that the defective memory cells are replaced with the redundant memory cells.

14. A redundant circuit, according to claim 13, wherein the data transmission circuits are read amplifiers, which amplify data transmitted from the data buses; and the buffer circuit is an output buffer circuit, which outputs the data transmitted from the read amplifiers to the outside device.

15. A redundant circuit, according to claim 13, wherein the data transmission circuits are write buffers, which temporally store data to be transmitted to the data buses; and the buffer circuit is an input buffer circuit, which temporally stores data to be transmitted to the data buses.

16. A redundant circuit used in a semiconductor memory, which comprises a primary data bus connected to primary memory cells; and a buffer circuit connected to an outside device, comprising:

redundant memory cells;

a redundant data bus which is connected to the redundant memory cells;

a single data transmission circuit, which is connected to the buffer circuit;

a gate circuit which is arranged between the data transmission circuit and the data buses; and a fuse which is connected to the gate circuit, wherein the redundant data bus is connected to the data transmission circuit by controlling the fuse and the gate circuit when the primary memory cells are determined to be defective, so that the defective memory cell are replaced with the redundant memory cells.

17. A redundant circuit, according to claim 16, wherein the data transmission circuit is a read amplifier, which amplifies data transmitted from the data buses; and the buffer circuit is an output buffer circuit, which outputs the data transmitted from the read amplifier to the outside device.

18. A redundant circuit, according to claim 16, wherein the data transmission circuit is a write buffer, which temporally stores data to be transmitted to the data buses; and the buffer circuit is an input buffer circuit, which temporally stores data to be transmitted to the data buses.

* * * * *